United States Patent
Voldman

(10) Patent No.: US 8,963,158 B2
(45) Date of Patent: Feb. 24, 2015

(54) STRUCTURE, STRUCTURE AND METHOD OF LATCH-UP IMMUNITY FOR HIGH AND LOW VOLTAGE INTEGRATED CIRCUITS

(71) Applicant: International Business Machines Corporation, Armonk, NY (US)

(72) Inventor: Steven H. Voldman, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 15 days.

(21) Appl. No.: 13/946,259

(22) Filed: Jul. 19, 2013

(65) Prior Publication Data

US 2013/0299915 A1    Nov. 14, 2013

Related U.S. Application Data

(63) Continuation of application No. 12/183,462, filed on Jul. 31, 2008, now Pat. No. 8,519,402.

(51) Int. Cl.

| | |
|---|---|
| *H01L 27/108* | (2006.01) |
| *H01L 27/092* | (2006.01) |
| *H01L 21/8238* | (2006.01) |
| *H01L 29/10* | (2006.01) |
| *H01L 29/78* | (2006.01) |
| *H01L 29/06* | (2006.01) |
| *H01L 29/08* | (2006.01) |

(52) U.S. Cl.
CPC ...... *H01L 27/092* (2013.01); *H01L 21/823892* (2013.01); *H01L 27/0921* (2013.01); *H01L 29/1079* (2013.01); *H01L 29/1083* (2013.01); *H01L 29/7816* (2013.01); *H01L 29/7835* (2013.01); *H01L 29/0638* (2013.01); *H01L 29/0653* (2013.01); *H01L 29/0847* (2013.01); *H01L 29/086* (2013.01); *H01L 29/0878* (2013.01); *H01L 29/1045* (2013.01)
USPC .............. 257/69; 257/E21.632; 257/E27.064; 257/E21.63; 257/E27.067

(58) Field of Classification Search
USPC .............. 257/69, E27.064, E21.632, E21.63, 257/E27.067
See application file for complete search history.

(56) References Cited

U.S. PATENT DOCUMENTS

| | | | |
|---|---|---|---|
| 4,735,911 | A | 4/1988 | Schaber |
| 4,762,802 | A | 8/1988 | Parrillo |
| 5,731,941 | A | 3/1998 | Hargrove et al. |
| 6,617,217 | B2 | 9/2003 | Nandakumar et al. |
| 6,657,264 | B2 | 12/2003 | Cho et al. |
| 6,747,294 | B1 | 6/2004 | Gupta et al. |
| 2004/0225490 | A1 | 11/2004 | Douady et al. |

OTHER PUBLICATIONS

Office Action dated Jul. 31, 2014 in U.S. Appl. No. 13/774,205; 7 pages.
Notice of Allowance dated Nov. 21, 2014 in U.S. Appl. No. 13/774,205; 7 pages.

*Primary Examiner* — Amar Movva
(74) *Attorney, Agent, or Firm* — Michael LeStrange; Roberts Mlotkowski Safran & Cole, P.C.

(57) ABSTRACT

Design structures, structures and methods of manufacturing structures for providing latch-up immunity for mixed voltage integrated circuits. The structure includes a diffused N-Tub structure embedded in a P-wafer and provided below a retrograde N-well to a non-isolated CMOS logic.

17 Claims, 6 Drawing Sheets

STRUCTURE, STRUCTURE AND METHOD OF LATCH-UP IMMUNITY FOR HIGH AND LOW VOLTAGE INTEGRATED CIRCUITS

FIELD OF THE INVENTION

The invention relates to integrated circuits, and more particularly, to design structures, structures and methods of manufacturing structures for providing latch-up immunity for mixed voltage integrated circuits.

BACKGROUND

Noise isolation and the elimination of complementary metal-oxide semiconductors (CMOS) latch-up are significant issues in advanced CMOS technology, radio frequency (RF) CMOS, and bipolar CMOS (BiCMOS) Silicon Germanium (SiGe) technology. Latch-up conditions typically occur within peripheral circuits or internal circuits, within one circuit (intra-circuit), or between multiple circuits (inter-circuit). In one such example, latch-up occurs when a PNPN structure transitions from a low current high voltage state to a high current low voltage state through a negative resistance region (i.e., forming an S-Type I-V (current/voltage) characteristic).

In particular, latch-up is known to be initiated by an equivalent circuit of a cross-coupled PNP and NPN transistor. With the base and collector regions being cross-coupled, current flows from one device leading to the initiation of the second device ("regenerative feedback"). These PNP and NPN elements can be any diffusions or implanted regions of other circuit elements (e.g., p-channel MOSFETs, n-channel MOSFETs, resistors, etc.) or actual pnp and npn bipolar transistors. In CMOS structures, the PNPN structure can be formed with a p-diffusion in a N-well, and a n-diffusion in a p-substrate ("parasitic PNPN"). In this case, the well and substrate regions are inherently involved in the latch-up current exchange between regions in the device.

The condition for triggering a latch-up is a function of the current gain of the PNP and NPN transistors, and the resistance between the emitter and the base regions. This inherently involves the well and substrate regions. The likelihood or sensitivity of a particular PNPN structure to latch-up is a function of a same combination of spacing (e.g., base width of the NPN and base width of the PNP), current gain of the transistors, substrate resistance and spacings, the well resistance and spacings, and isolation regions.

Latch-up can also occur as a result of the interaction of an electrostatic discharge (ESD) device, the input/output (I/O) off-chip driver and adjacent circuitry initiated in the substrate from overshoot and undershoot phenomena. These factors can be generated by CMOS off-chip driver circuitry, receiver networks, and ESD devices. In CMOS I/O circuitry, undershoot and overshoot can lead to injection in the substrate, and simultaneous switching of circuitry where overshoot or undershoot injection occurs may lead to both noise injection and latch-up conditions. Also, supporting elements in these circuits, such as pass transistors, resistor elements, test functions, over voltage dielectric limiting circuitry, bleed resistors, keeper networks and other elements can be present, contributing to noise injection into the substrate and latch-up.

With the scaling of standard CMOS technology, the spacing of the p+/n+ space decreases, leading to a lower trigger condition and the onset of CMOS latch-up. With the scaling of the shallow trench isolation (STI) for aspect ratio, the vulnerability of CMOS technology to latch-up has increased. Vertical scaling of the wells, and lower N-well and P-well implant doses also has increased the lateral parasitic bipolar current gains, leading to lower latch-up robustness.

With the transition from p+ substrates to low doped p-substrates, the latch-up robustness has continued to decrease. Also, the effectiveness of N-wells as guard ring structures may reduce internal and external latch-up problems. But, with mixed signal applications and radio frequency (RF) chips, a higher concern for noise reduction has lead to the continued lowering of the substrate doping concentration. This continues to lead to lower latch-up immunity in mixed signal applications and RF technologies.

Latch-up also can occur from voltage or current pulses that occur on the power supply lines. Transient pulses on power rails (e.g., substrate or wells) can trigger latch-up processes. Latch-up can also occur from a stimulus to the well or substrate external to the region of a thyristor structure from minority carriers.

Latch-up can be initiated from internal or external stimulus, and is known to occur from single event upsets (SEU), which can include terrestrial emissions from nuclear processes, and cosmic ray events, as well as events in space environments. Cosmic ray particles can include proton, neutron, and gamma events, as well as a number of particles that enter the earth atmosphere. Terrestrial emissions from radioactive events, such as alpha particles, and other radioactive decay emissions can also lead to latch-up in semiconductors.

Latch-up can lead to failure of space applications triggered by cosmic rays, heavy ions, proton and neutron events. The higher the latch-up margin in military and outer space applications, the higher the vulnerability to single even upset (SEU) initiated latch-up.

Smart power technology today consists of high voltage CMOS (HVCMOS) integrated with low voltage CMOS (LVCMOS). In these technologies, the HVCMOS sectors utilize lateral diffused MOS (LDMOS) transistors. Applications voltages vary with the product. In the 80V to 120V application range, products consist of automotive, telecommunication, and power supplies. In the 20V to 80V application range, products consist of automotive displays, inkjet printers, DC/DC converters, to controllers. Below 20V application voltages, products consist of controllers, cell phones to standard low voltage electronics. System-on-chip integration can include a mixture of high voltage CMOS, digital, and analog circuitry; these systems can include voltage regulators, interface networks, digital-to-analog converters, analog-to-digital converters, current references, oscillators, current references, filters, to power management supervisors. Crosstalk, noise and latch-up are common concerns in these products.

In the semiconductor manufacturing of LDMOS transistors, there are two types of transistors typically constructed. For medium voltage (MV) applications, the lateral diffused drain structures are placed under the MOSFET gate for the MOSFET source and drain. In the high voltage (HV) applications, a high voltage LDMOS transistors, isolation (LOCOS or shallow trench isolation (STI)) is placed under the MOSFET gate drain region.

To apply high voltage to the LDMOS transistors, many uniquely defined implants exist for the LDMOS transistor. For LDMOS technology, deep diffused wells are used for the LDMOS transistor. This deep diffused well implant is unique to the LDMOS transistor. In the section of the LDMOS transistors, lower doped "body" implants are formed for the p- and n-region. These P-body and N-body implants are unique to the LDMOS transistor. In the LDMOS drain regions, nonself aligned implants are used. In addition, in the case of the high voltage LDMOS transistor, the drain region extends under the isolation structure.

In the production of advanced low voltage CMOS (LVCMOS) technology on the same substrate as high voltage LDMOS technology, the current injection from LDMOS or the high voltage sector of a mixed voltage chip can be significant.

During inductive load dumps, the large area LDMOS transistor can discharge electrons into the substrate of a SOC product. Electron injection into the substrate can lead to disruption and triggering of the low voltage CMOS (LVCMOS) logic circuitry. As a result, it is desirable to have LVCMOS logic circuitry that is latch-up immune. Hence, it is desirable to provide latch-up robust low voltage CMOS technology in a mixed voltage application.

Accordingly, there exists a need in the art to overcome the deficiencies and limitations described hereinabove.

SUMMARY

In a first aspect of the invention, there is provided a structure comprising a diffused N-Tub structure embedded in a P-wafer and provided below a retrograde N-well to a non-isolated CMOS logic for the low voltage CMOS p-channel MOSFET transistor.

In embodiments, an edge of the diffused N-Tub is recessed relative to the N-well. The recessed edge is due to the large out-diffusion cycle of the LDMOS diffused well process. The combined well of the diffused LDMOS N-Tub and CMOS retrograde n-well reduces a vertical parasitic PNP bipolar gain of the CMOS logic. The combination of the diffused N-Tub and the retrograde n-well lowers the shunt resistance to a n-well contact, and improves the latch-up robustness of the low voltage CMOS technology. It also does not impact a P+/N+ space of the CMOS logic. The retrograde n-well is embedded in the diffused N-Tub structure. After outdiffusion, the retrograde well can be contained inside the diffused N-Tub structure.

In embodiments, a second diffused N-tub structure is embedded in the p-wafer and associated with an N+ type LDMOS device (also known as NDMOS). The second diffused N-Tub structure being separated from the first N-Tub structure by a trench isolation structure. A second region is formed in the low voltage CMOS p-channel MOSFET. In the low voltage CMOS (LVCMOS) p-channel MOSFET, an LDMOS N-body region is embedded in the retrograde N-well, wherein the retrograde N-well is below the N-body. A third region is formed in the low voltage CMOS p-channel MOSFET. A LDMOS shallow n+ implant (SN) implant below an N+ diffusion of the CMOS logic. The SN implant depth is between the n+ MOSFET source/drain implant and the bottom of the STI isolation. A plurality of combinations and permutations can be formed with the DN, N-body and SN implant combined with the low voltage CMOS N-well to form a more latch-up robust low voltage CMOS transistor.

In a second aspect of the invention, there is provided a structure comprising a first dopant type structure embedded in a diffused deep well structure formed of a same dopant type of the first dopant type structure. The diffused deep well structure is associated with a non-isolated CMOS logic. The diffused deep well structure is embedded in a p-wafer and provided below the first dopant type structure.

In embodiments, the diffused deep well structure is a P-Tub (DP). The diffused deep well structure is a diffused N-Tub (DN implant). The first dopant type structure is an N-body which is embedded in an N-well, and the diffused N-tub (DN) is below the N-body and the N-well. A second diffused N-Tub is also provided [??]. A P-well is adjacent and in contact with the N-well. The diffused deep well structure is an N-well positioned below an N-body. An SN implant is below an N+ diffusion of a P+ type device which is configured to lower a substrate and well shunt resistance thereby improving CMOS latch-up.

In a third aspect of the invention, there is provided a shallow trench isolation defined n-channel MOSFET contained within a well structure comprising: a P-well implant region of a LDMOS transistor; a P-body implant region embedded in the retrograde P-well implant region; a shallow P type implant region embedded in the retrograde P-well implant region; and a low resistance shunt for latch-up comprising an N-Tub for a non-isolated CMOS logic. The low resistance shunt being embedded in a p-wafer.

In a fourth aspect of the invention, there is provided a shallow trench isolated defined p-channel MOSFET contained within a well structure comprising: a retrograde N-well implant region; an N-body type implant region of a LDMOS transistor embedded in the retrograde N-well implant region; a shallow N-type implant region retrograde embedded in the N-well implant region; and a low resistancee shunt for latch-up improvement comprising an N-Tub for a non-isolated CMOS logic. The low resistance shunt being embedded in a p-wafer.

In a fifth aspect of the invention, there is provided a design structure embodied in a machine readable medium for designing, manufacturing, or testing an integrated circuit. The design structure comprises a first dopant type structure embedded in a diffused deep well structure formed of a same dopant type of the first dopant type structure. The diffused deep well structure is associated with a non-isolated CMOS logic. The diffused deep well structure is embedded in a p-wafer and provided below the first dopant type structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
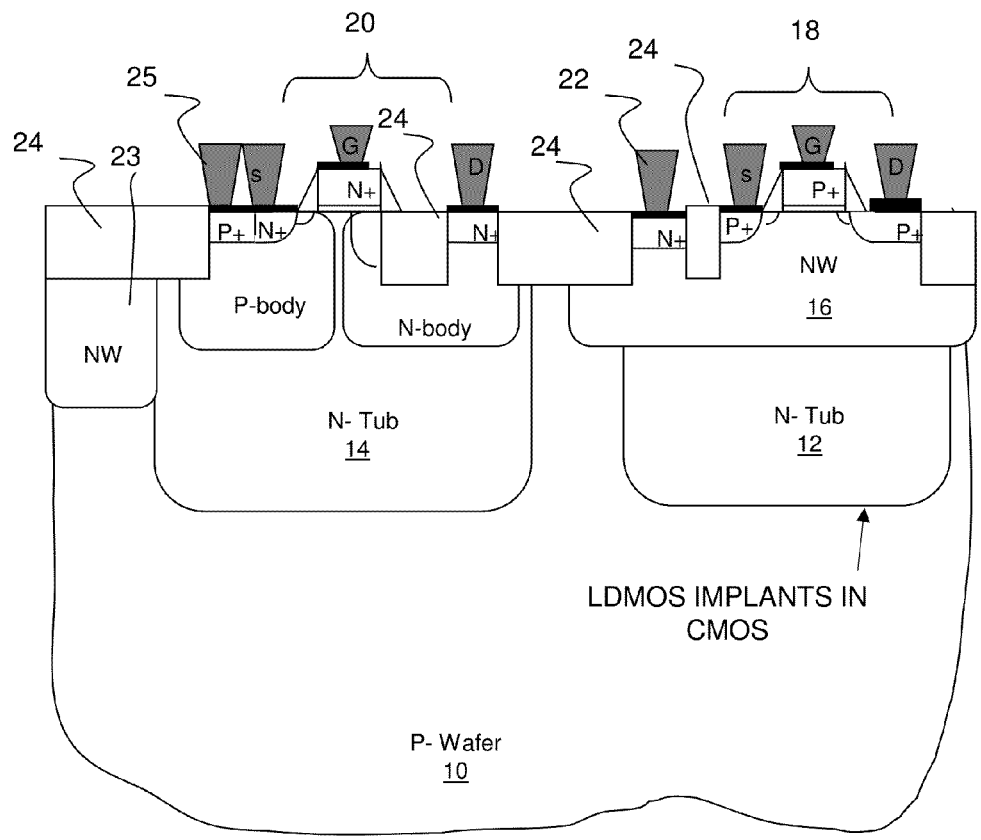
FIG. 1 shows a high voltage laterally diffused metal oxide semiconductor (LDMOS) and low resistance shunt MOSFET with CMOS retrograde N-well (NW) and LDMOS diffused N-Tub (DN) in accordance with aspects of the invention.

The invention relates to integrated circuits, and more particularly, to design structures, structures and methods of manufacturing structures for providing latch-up immunity for mixed voltage integrated circuits. In the invention, the diffusion and implants of the high voltage CMOS (HVCMOS) implants are placed in the low voltage CMOS devices. As such, the implants of the LDMOS transistor are placed into the low voltage CMOS devices to provide latch-up improvement to the low voltage CMOS transistors and low voltage CMOS chip sector. This is achieved by (a) reduction of parasitic bipolar current gains, and (b) reduction of the shunt resistance for the n-channel and p-channel low voltage CMOS transistors. The LDMOS regions of a common dopant polarity that are deeper than the CMOS implants provide an increase in the effective base width for the parasitics of the CMOS technology. LDMOS regions which increase the doping concentration can also lower the bipolar current gain by an increase in the total dopants in the parasitic bipolar transistor (e.g., increased Gummel Number). In addition, by increasing the total dopants of the well regions, the shunt resistance between the MOSFET and their respective contacts are reduced, preventing forward biasing of the parasitics in the low voltage CMOS transistors.

In high voltage CMOS, LDMOS devices are constructed adjacent to latch-up sensitive CMOS circuitry. However, LDMOS devices, due to a current reversal effect, lead to injection of electrons causing latch-up problems. Current technology uses low dose well implants below the low voltage CMOS sectors, leading to latch-up sensitive CMOS logic and analog circuits in smart power applications. For this and other reasons, the present invention provides latch-up robust low voltage CMOS in HVCMOS technology.

To address the problem of latch-up, in embodiments, a diffused N-Tub structure is added below a standard retrograde N-well to the low voltage non-isolated CMOS logic. In embodiments an edge of the N-Tub is recessed relative to the N-well and P+/N+ space to avoid enhancement of the lateral bipolar transistor and adjust for the long diffusion cycle for the diffused well implant. With a recessed edge (N-Tub to N-well space), the deep well does not impact the P+/N+ space but does reduce the vertical bipolar gain of the PNP as well as lower the shunt resistance to the well contact.

In still further embodiments, an integration of a diffused deep P-well region and the retrograde well-implanted P-well are combined to improve CMOS latch-up. In further embodiments, the implanted retrograde P-well is placed to match the outdiffusion of the deep P-well, wherein the intersection of the deep P-well/retrograde P-well does not shift the N-well and placement below the STI region. In further embodiments, the LDMOS implants (e.g., deep and shallow body P-type and N-type implants and N-Tub) into the low voltage logic on top of N-well (NW) and P-well (PW) implants are provided to lower the substrate and well shunt resistances to improve CMOS latch-up.

First Aspect of the Invention

FIG. 1 shows a laterally diffused metal oxide semiconductor (LDMOS) and low resistance shunt MOSFET with retrograde N-well and diffused N-Tub in accordance with aspects of the invention. More specifically, FIG. 1 shows a first diffused N-Tub 12 and a second diffused N-Tub 14 embedded in a P-wafer 10. A retrograde N-well to a non-isolated CMOS logic is embedded in the diffused N-Tub 12. In embodiments, the P-wafer (substrate) 10 may be Silicon or Germanium, but other materials and/or substrates may equally be used, such as for example, SOI.

The first N-Tub 12 and the second N-Tub 14 are deep well structures. In embodiments, the first N-Tub 12 and second N-Tub 14 can be formed through a conventional ion implantation process, using dopants such as, for example, Arsenic (As), Antimony (Sb), Phosphorous (P), or other N doped elements followed by a long diffusion process. The N-Tub dimension for LDMOS transistor can be 6 um deep, whereas the low voltage CMOS retrograde well implants are less than 1.5 um.

The P+ type device 18 is formed in a conventional manner such that no further explanation is required herein for an understanding of the invention. The P+ type device 18 includes P+ diffusion regions, as well as contacts for source, drain and ground (labeled S, D and G, respectively). An N+ diffusion region is provided adjacent the P+ type device 18, and includes an N-well contact 22. The N+ diffusion region and the P+ diffusion regions are embedded in the retrograde N-well 16 such that the retrograde N-well 16 extends past the P+ and N+ diffusion regions of the P+ type device 18.

A P-body and N-body (also referred to as EP and EN, respectively) of an N+ type device 20 are embedded in the second N-Tub 14. The second N-Tub 14 is in contact with an edge of an N-well 23. The N+ type device 20 is formed in a conventional manner such that no further explanation is required herein for an understanding of the invention. The N+ type device 20 includes N+ diffusion regions embedded in the N-body and P-body. A P+ diffusion region is adjacent to one of the N+ diffusion regions of the N+ type device 20 and embedded in the P-body. The N-Tub 14 extends beyond the P+ and N+ diffusion regions. The N+ type device 20 includes contacts for source, drain and gate (labeled S, D and G, respectively). In the embodiment of FIG. 1, an N+ diffusion region of the P+ type device 18 and an N+ diffusion region of the N+ type device 20 are adjacent but isolated from one another by an STI structure 24. A P+ body contact 25 is shown making contact with the P-body of the P+ device 20.

In embodiments, the invention limits diffused well outdiffusion of the N-Tub 12 integrated to the low voltage CMOS retrograde well (e.g., N well 16) by making adjustments for the outdiffusion in the process flow. In further embodiments, the diffused N-Tub 12 is placed away from the P+/N+ space of the P+ device 18 to avoid enhancement of the lateral bipolar current gain bnpn due to increased depth. Also, an edge of the N-Tub 12 is recessed relative to the N-well 16 to avoid enhancement of the lateral bipolar transistor and adjust for the long diffusion cycle for the diffused well implant. With a recessed edge (DN to NW space), the N-Tub 12 does not impact the p+/n+ spacing but does reduce the vertical bipolar gain of the PNP as well as lower the shunt resistance to the well contact.

Second Aspect of the Invention

Figure 2:
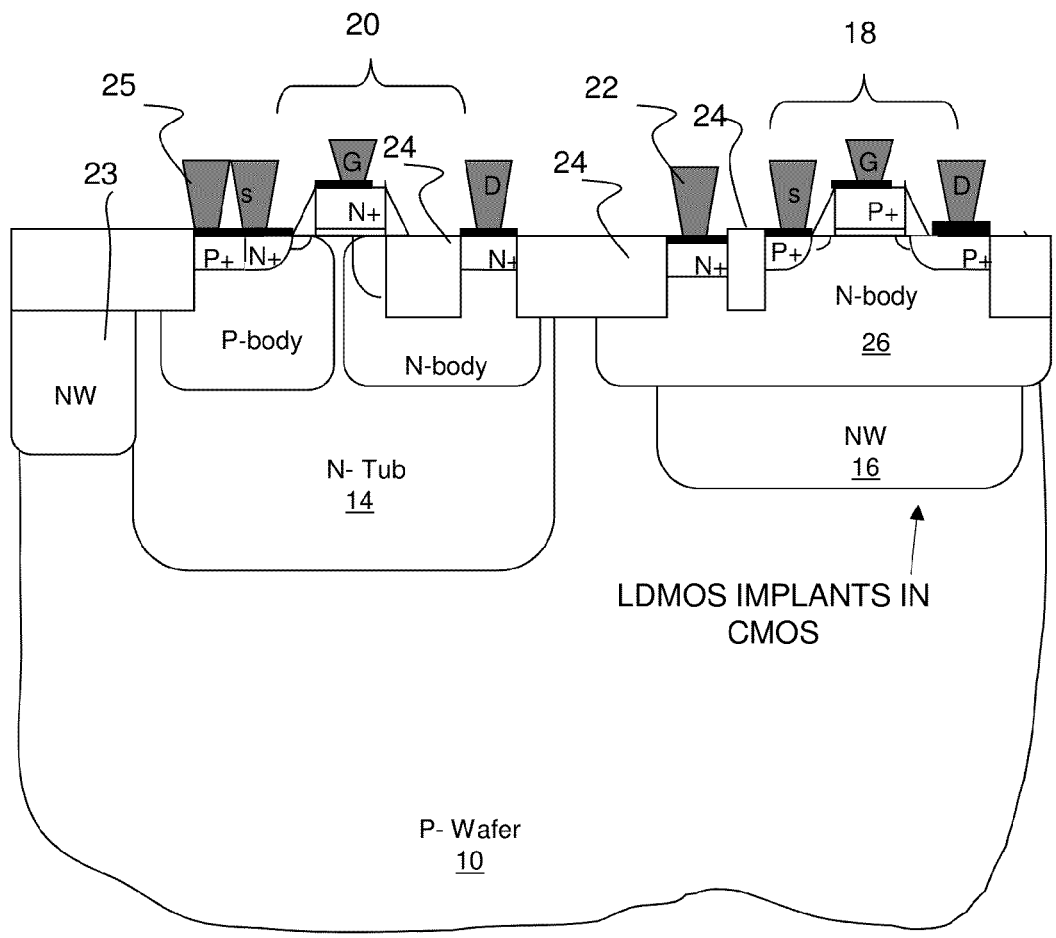
FIG. 2 shows a high voltage n-type laterally diffused metal oxide semiconductor (NDMOS) and low resistance shunt MOSFET with a LDMOS N-body and CMOS NW in accordance with aspects of the invention.

FIG. 2 shows a level n-type laterally diffused metal oxide semiconductor (NDMOS) and low resistance shunt MOSFET with LDMOS N-body and CMOS NW (N-well) in accordance with aspects of the invention. More specifically, FIG. 2 shows an N-body 26 embedded in the retrograde N-well 16 of the conventional P+ type device 18. The N-body 26 is also referred to as "EN", similar to the N-Body of the N+ type device 20. The LDMOS N-body 26 acts as a low resistance shunt in the CMOS. The edges of the retrograde N-well 16 are recessed with respect to the N-body 26. The N-body 26 and N-well 16 can be formed through a conventional ion implantation process, using dopants such as, for example, Arsenic (As), Antimony (Sb), Phosphorous (P), or other N doped elements. Additionally, the N-well 16 is not as deep as the N-Tub 14.

As in the previous embodiment, the second N-Tub 14 is a deep well structure and is adjacent to and in contact with an N-well 23. In embodiments, the second N-Tub 14 can be formed through a conventional ion implantation process and followed by a long diffusion process, using dopants such as, for example, Arsenic (As), Antimony (Sb), Phosphorous (P), or other N doped elements.

The P+ type device 18 includes P+ diffusion regions, as well as contacts for source, drain and gate (labeled S, D and G, respectively). An N+ diffusion region includes an N-body contact 22 for making contact with the N-body 26. The N+ diffusion is provided adjacent the P+ type device 18. The N+ diffusion region and the P+ diffusion regions are embedded in the N-body 26. A P+ diffusion region and the N+ diffusion region of the P+ type device 18 is separated by a conventionally formed STI structure 24. The retrograde N-well 16 and N-body 26 extend past the P+ diffusion regions of the P+ type device 18 and the N+ diffusion region.

A P-body and N-body (also referred to as EP and EN, respectively) of the N+ type device 20 is embedded in the second N-Tub 14. The N+ type device 20 includes N+ diffusion regions embedded in the P-body and N-body, respectively. A P+ diffusion region is adjacent to one of the N+ diffusion regions of the N+ type device 20 and embedded in the P-body. A P+ body contact 25 is shown making contact to the P-body of the P+ device 20. The N+ type device 20 includes contacts for source, drain and gate (labeled S, D and G, respectively). The N-Tub 14 extends past the P+ and N+ diffusion regions and is deeper than the N-well 16.

Third Aspect of the Invention

Figure 3:
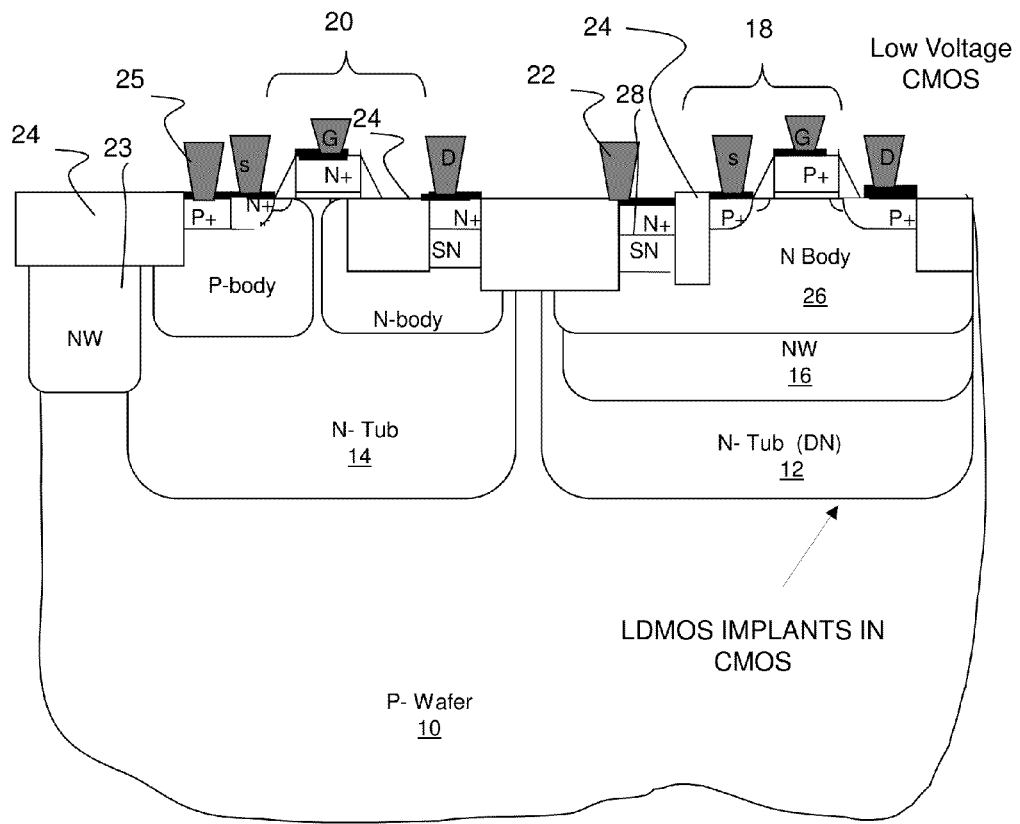
FIG. 3 shows a high voltage laterlly diffused metal oxide semiconductor (NDMOS) and low resistance shunt MOSFET with LDMOS N-Tub (DN), LDMOS drain extension implant (SN), LDMOS N-body region, and CMOS N-Well in accordance with aspects of the invention.

FIG. 3 shows a high voltage NDMOS (also known as a level shift NDMOS or an asymmetric drain LDMOS device), and low resistance shunt p-channel MOSFET with LDMOS N-Tub, LDMOS SN, LDMOS N-body LDMOS and CMOS NW in accordance with aspects of the invention. More specifically, FIG. 3 shows a combination of FIG. 1 and FIG. 2, with the addition of a shallow N type diffusion implant (SN) 28 below the N+ diffusion of the P+ type device 18 (and the N+ type device 20) to lower the well shunt resistance thereby improving CMOS latch-up. In embodiments, a shallow P type diffusion implant (SP) below the P+ diffusion of the P+ type device 18 (or N+ type device 20) is also contemplated by the invention. In embodiments, the SN 28 (or SP) are fabricated in the well regions in a PFET and NFET low voltage CMOS region, by mask openings provided to allow for the implantation of in the respective wells adjacent to the transistors. In embodiments, the well recombination times are reduced. Additionally, the resistance of the N-well and the P-well will be reduced, improving the latch-up robustness of the base CMOS.

Accordingly, the present invention contemplates a shallow trench isolated defined n-channel MOSFET contained within a well structure comprising: an EP implant region of a LDMOS transistor; an SP implant region of the LDMOS transistor; a retrograde P-well implant region; and a low resistance shunt for latch-up improvement. Also, the present invention contemplates a shallow trench isolated defined p-channel MOSFET contained within a well structure comprising: an EN implant region of a LDMOS transistor; an SN implant region of the LDMOS transistor; at least one retrograde N-well implant region; and a low resistance shunt for latch-up improvement. It should be recognized that the EP, SP, SN and EN implants can be implemented in any of the embodiments discussed herein.

As in the previous embodiments, the first N-Tub 12 and the second N-Tub 14 are deep well structures embedded in the p-wafer 10. In the embodiment of FIG. 3, though, the retrograde N-well 16 and the N-body 26 of a conventional P+ type device 18 are embedded in the first N-Tub 12. The N-body 26 is embedded in the retrograde N-well 16. In embodiments, the first N-Tub 12, second N-Tub 14, N-well 16 and the N-body 26 can be formed through a conventional ion implantation process followed by a diffusion process, using dopants such as, for example, Arsenic (As), Antimony (Sb), Phosphorous (P), or other N doped elements.

The P+ type device 18 includes P+ diffusion regions, as well as contacts for source, drain and gate (labeled S, D and G, respectively). An N+ diffusion region includes a contact 22 to the N-body 26. The N+ diffusion region is embedded in or is above an SN implant 28. The SN implant 28 is shallower than an adjacent STI structure 24. A P+ diffusion region of the P+ type device 18 and the N+ diffusion region is separated by a conventionally formed STI structure 24, which is deeper than the SN implant 28.

A P-body and N-body (also referred to as EP and EN, respectively) of the N+ type device 20 is embedded in the second N-Tub 14. The second N-Tub 14 is in contact with an edge of an N-well 23. The N+ type device 20 includes N+ diffusion regions embedded in the respective P-body and N-body. An N+ diffusion region of the N+ type device is embedded in an SN implant) A P+ diffusion region is embedded in the P-body and is adjacent to the N+ diffusion region. A P+ body contact 25 is shown making contact to the P-body of the P+ device 20. In the embodiment of FIG. 3, the N+ diffusion regions associated with the P+ type device 18 and the N+ type device 20 are adjacent but isolated from one another by an STI structure 24. The N+ type device 20 includes contacts for source, drain and gate (labeled S, D and G, respectively).

As previously described, in embodiments, the invention limits diffused well out-diffusion of the N-Tub 12 integrated to the low voltage CMOS retrograde well (e.g., N well 16) by making adjustments for the outdiffusion in the process flow. In further embodiments, the diffused N-Tub 12 is placed away from the P+/N+ space of the P+ device 18 to avoid enhancement of the lateral bipolar current gain bnpn due to increased depth.

Fourth Aspect of the Invention

Figure 4:
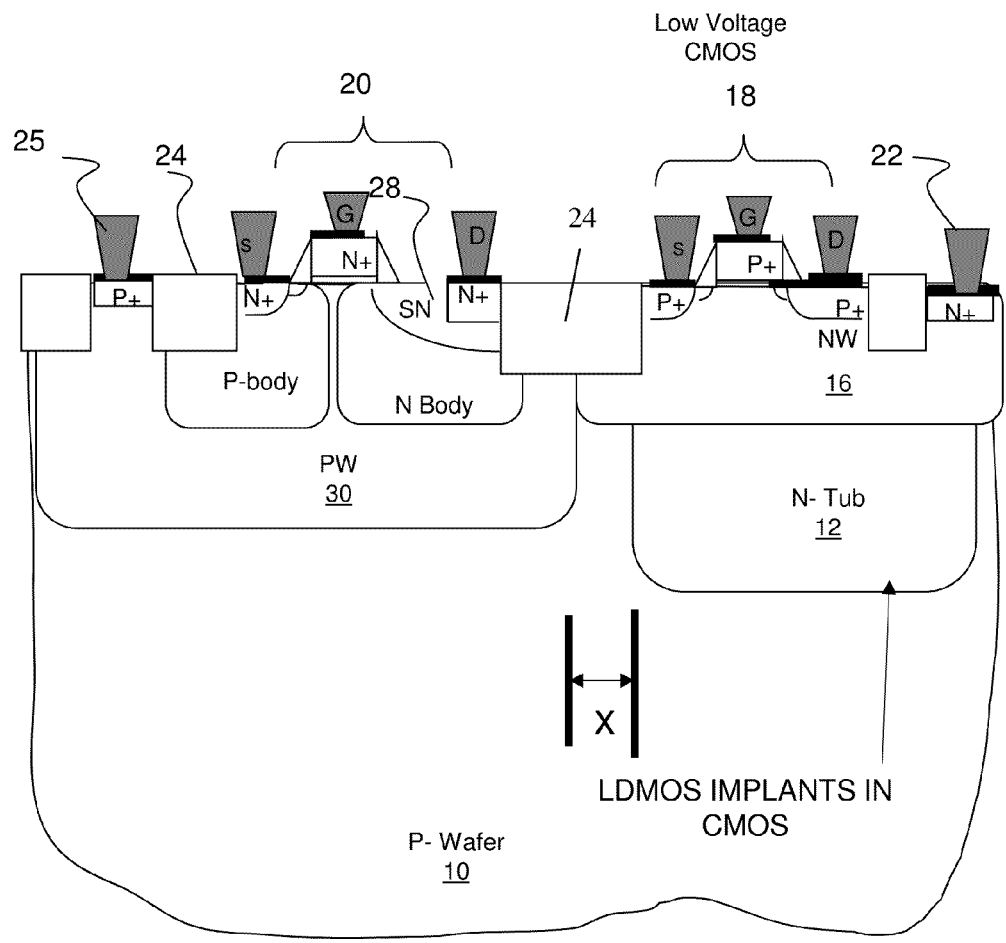
FIG. 4 shows a medium voltage LDMOS transistor (MV LDMOS) transistor and a n-channel low resistance shunt MOSFET with CMOS retrograde NW and LDMOS diffused N-Tub (DN) in accordance with aspects of the invention.

FIG. 4 shows a low resistance shunt MOSFET with retrograde N-well and diffused N-Tub in accordance with aspects of the invention. Similar to the embodiment of FIG. 1, the diffused N-Tub 12 is embedded in the P-wafer 10. In embodiments, the N-Tub 12 is formed below a standard retrograde N-well 16 to a non-isolated CMOS logic of a conventional P+ type device 18. That is, the standard retrograde N-well 16 is embedded in the N-Tub 12. At least one edge of the first diffused N-Tub 12 is recessed with respect to the standard retrograde N-well 16. The diffused N-Tub 12 is provided below a retrograde N-well to a non-isolated CMOS logic.

The P+ type device 18 is formed in a conventional manner such that no further explanation is required herein for an understanding of the invention. The P+ type device 18 includes P+ diffusion regions, as well as contacts for source, drain and gate (labeled S, D and G, respectively). An N+ diffusion region includes a contact 22 for contacting with the N-well 16. The N+ diffusion region and the P+ diffusion regions are embedded in the standard retrograde N-well 16. The retrograde N-well 16 extends past the P+ diffusion regions and the N+ diffusion region. A P+ diffusion region of the P+ type device 18 and the N+ diffusion region are separated by a conventionally formed STI structure 24.

The N+ type device 20 is formed in a conventional manner such that no further explanation is required herein for an understanding of the invention. For example, the N+ type device 20 includes a retrograde P-well 30 embedded in the P-wafer 10, adjacent to the N-well 16. The N+ type device 20 also includes N+ diffusion regions embedded in the P-well 30. The N+ diffusion region is embedded in an SN implant 28, which is shallower than the adjacent STI structure 24. A P+ diffusion region is adjacent to one of the N+ diffusion regions of the N+ type device 20 and separated therefrom by an STI structure 24. The N+ type device 20 includes contacts for source, drain and gate (labeled S, D and G, respectively). A P+ body contact 25 is shown making contact to the P-body of the P+ device 20.

The P-well 30 extends past the P+ and N+ diffusion regions and is adjacent to and in contact with the retrograde N-well 16. In the embodiment of FIG. 4, a P+ diffusion region of the P+ type device 18 and an N+ diffusion region of the N+ type device 20 are adjacent but isolated from one another by an STI structure 24.

It should be understood by those of skill in the art that the N+ type device 20 can equally be a P-type device with a shallow P-type (SP) implant region, instead of an SN implant. In this embodiment, the P-type regions will be modified with N type regions and vice versa.

In embodiments, the invention limits diffused well outdiffusion of the N-Tub 12 integrated to the low voltage CMOS retrograde well (e.g., N well 16) by making adjustments for the outdiffusion in the process flow. In further embodiments, the diffused N-Tub 12 is placed away from the P+/N+ space of the P+ device 18 to avoid enhancement of the lateral bipolar current gain bnpn due to increased depth. Also, an edge of the N-Tub 12 is recessed relative to the N-well 16 to avoid enhancement of the lateral bipolar transistor and adjust for the long diffusion cycle for the diffused well implant. With a recessed edge (DN to NW space), the N-Tub 12 does not impact the p+/n+ spacing but does reduce the vertical bipolar gain of the pnp as well as lower the shunt resistance to the well contact.

Fifth Aspect of the Present Invention

Figure 5:
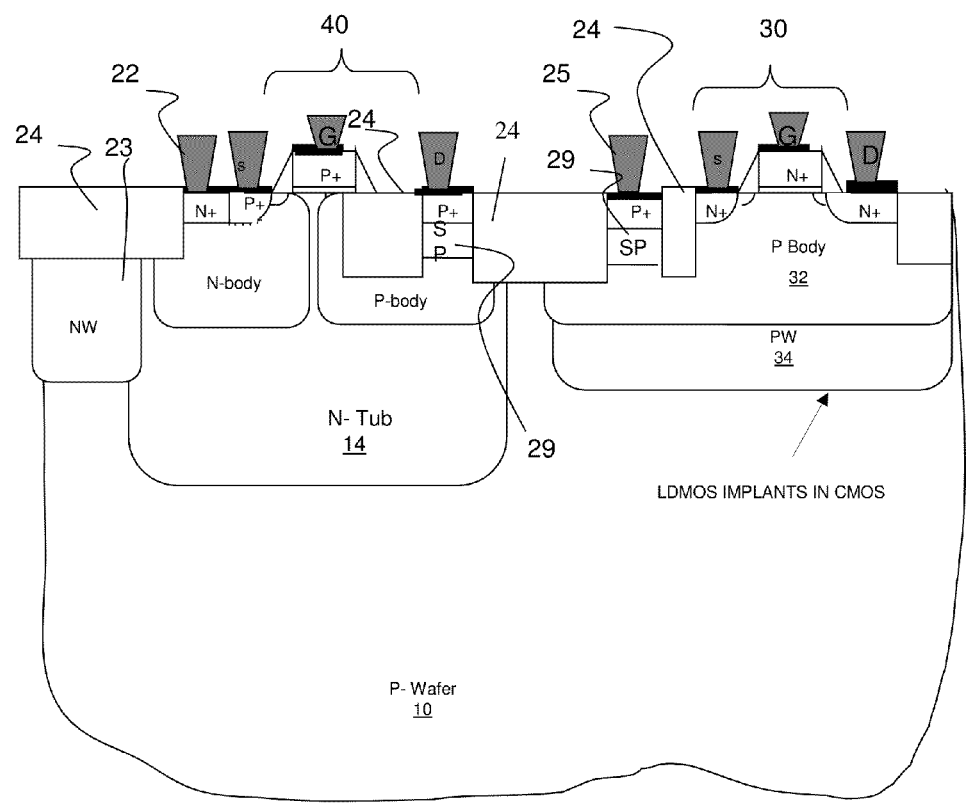
FIG. 5 shows a high voltage p-channel LDMOS and low resistance shunt MOSFET with a LDMOS P-body implant, a LDMOS drain extension implant (SP), and CMOS P-well implant in accordance with aspects of the invention.

FIG. 5 shows a level shift NDMOS and low resistance shunt MOSFET with P-body LDMOS/PW (P-well) in accordance with aspects of the invention. More specifically, FIG. 5 shows an N+ device 30 and a P+ type device 40. The N+ device 30 includes a P-body 32 (also referred to as EP) embedded in a diffused P-well 34. The diffused P-well 34 is embedded in a P-wafer 10. In embodiments, the P-wafer (substrate) 10 may be Silicon or Germanium, but other materials and/or substrates may equally be used, such as for example, SOI. The P-well 34 can be formed through a conventional ion implantation process. In embodiments, the P-well 34 is formed below a standard retrograde P-body 32.

The N+ type device 30 is formed in a conventional manner such that no further explanation is required herein for an understanding of the invention. The N+ type device 30 includes an N+ diffusion regions and a P+ diffusion region, as well as contacts for source, drain and gate (labeled S, D and G, respectively). The P+ diffusion region includes a contact 25 to provide contact to the P-body 24. The P+ diffusion region is embedded in a shallow P type implant region (SP) 29, which is shallower than the adjacent STI structure 24. The P+ and N+ diffusion regions are embedded in the P-body 32. The P+ and N+ diffusion regions are separated by a conventionally formed STI structure 24. The P-well 32 and the P-body 34 extend past the P+ and N+ diffusion regions. In embodiments, at least one edge of the P-well 34 is recessed with respect to the P-well 32.

A P-body and N-body (also referred to as EP and EN, respectively) of the P+ type device 40 are embedded in the N-Tub 14. The N-Tub 14 is in contact with an edge of an N-well 23 and is deeper than the P-well 34. The P+ type device 40 is formed in a conventional manner such that no further explanation is required herein for an understanding of the invention. The P+ type device 40 includes P+ diffusion regions embedded in the N-body and P-body. An N+ diffusion region is adjacent to one of the P+ diffusion regions of the N+ type device 40 and embedded in the P-body. The N+ diffusion region includes a contact 22 which provides contact to the N-body.

The N-Tub 14 extends past the P+ and N+ diffusion regions. In the embodiment of FIG. 5, a P+ diffusion region of the P+ type device 40 is embedded in an SP implant 29, adjacent to an STI structure 24. The STI structure 24 is deeper than the SP implant 29 of both the P+ type device 40 and the N+ type device 30. The P+ type device 40 includes contacts for source, drain and gate (labeled S, D and G, respectively).

Design Structure

Figure 6:
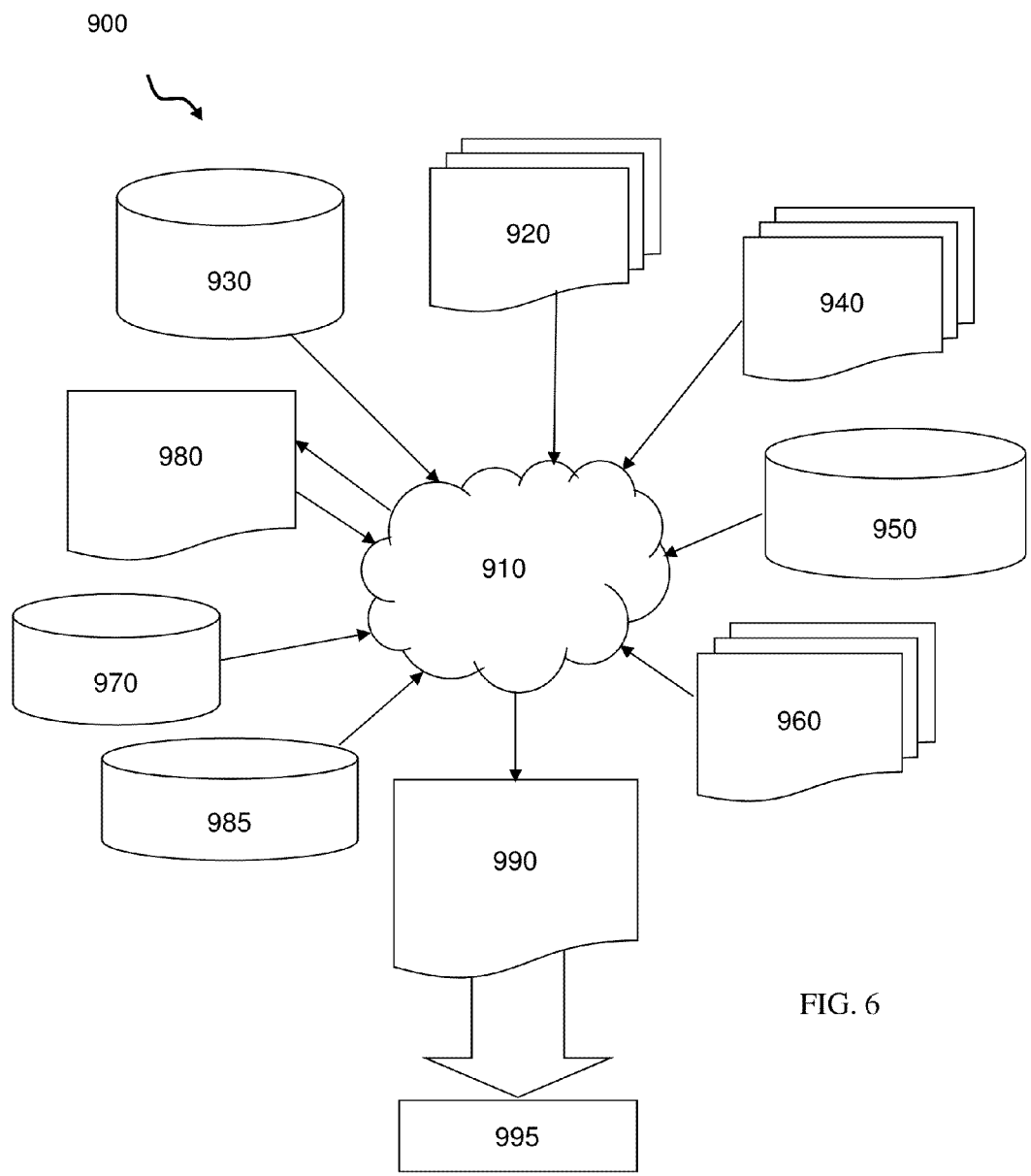
FIG. 6 is a flow diagram of a design process used in semiconductor design, manufacture, and/or test.

FIG. 6 shows a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in FIGS. 1-5. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A structure comprising a diffused N-Tub structure embedded in a P-wafer and provided below a retrograde N-well to a non-isolated CMOS logic, wherein at least one downwardly extending lateral edge of the diffused N-Tub and a downwardly extending lateral edge of the retrograde N-well, on a same side, are recessed with respect to one another, and wherein the P-wafer directly contacts a bottom surface of the retrograde N-well.

2. The structure of claim 1, wherein the recessed downwardly extending lateral edge of the diffused N-Tub reduces a vertical bipolar gain of a PNP of the CMOS logic.

3. The structure of claim 1, wherein the recessed downwardly extending lateral edge of the diffused N-Tub lowers a shunt resistance to a well contact and does not impact a P+/N+ space of the CMOS logic.

4. The structure of claim 1, wherein the retrograde N-well is embedded in the diffused N-Tub structure.

5. The structure of claim 1, further comprising a second diffused N-Tub structure embedded in the p-wafer and associated with an N+ type device, the second diffused N-Tub structure being separated from the first N-Tub structure by a trench isolation structure.

6. The structure of claim 1, further comprising an N-body embedded in the retrograde N-well, wherein the retrograde N-well is below the N-body.

7. The structure of claim 1, further comprising a P+ type device including P+ type source and drain regions in the N-well.

8. The structure of claim 7, further comprising an N-well contact comprising an N+ diffusion region in the N-well.

9. The structure of claim 1, further comprising:
a second N-Tub in the P-wafer; and
a shallow trench isolation region between and contacting the N-well and the second N-Tub.

10. The structure of claim 9, further comprising a second N-well contacting the second N-Tub.

11. The structure of claim 9, further comprising a P-body and an N-body of an N+ type device embedded in the second N-Tub.

12. The structure of claim 1, further comprising a P-well structure embedded in the p-wafer and associated with an N+ type device.

13. The structure of claim 1, further comprising an N+ type device including a P-body and an N-body embedded within a P-well structure embedded in the p-wafer.

14. The structure of claim 1, wherein a lateral dimension of the retrograde N-well defined by a distance between the downwardly extending lateral edge of the retrograde N-well and an opposite downwardly extending lateral edge of the retrograde N-well is greater than a lateral dimension of the diffused N-Tub defined by a distance between the downwardly extending lateral edge of the diffused N-Tub and an opposite downwardly extending lateral edge of the diffused N-Tub.

15. The structure of claim 1, wherein:
the downwardly extending lateral edge of the diffused N-Tub is a vertical edge of the diffused N-Tub; and
the downwardly extending lateral edge of the retrograde N-well is a vertical edge of the retrograde N-well.

16. The structure of claim 1, wherein:
the diffused N-Tub is defined by the downwardly extending lateral edge of the diffused N-Tub, a bottom edge of the diffused N-Tub, and a rounded corner edge of the diffused N-Tub that extends between the downwardly extending lateral edge of the diffused N-Tub and the bottom edge of the diffused N-Tub; and
the retrograde N-well is defined by the downwardly extending lateral edge of the retrograde N-well, a bottom edge of the retrograde N-well, and a rounded corner edge of the retrograde N-well that extends between the downwardly extending lateral edge of the retrograde N-well and the bottom edge of the retrograde N-well.

17. A structure comprising a diffused N-Tub structure embedded in a P-wafer and provided below a retrograde N-well to a non-isolated CMOS logic, wherein at least one downwardly extending lateral edge of the diffused N-Tub and a downwardly extending lateral edge of the retrograde N-well, on a same side, are recessed with respect to one another, wherein the P-wafer directly contacts all of: a bottom surface of the retrograde N-well, the downwardly extending lateral edge of the retrograde N-well, and a rounded corner extending from the downwardly extending lateral edge of the retrograde N-well to the downwardly extending lateral edge of the retrograde N-well.

* * * * *